United States Patent

Melton et al.

[11] Patent Number: 4,683,043
[45] Date of Patent: Jul. 28, 1987

[54] CUBIC BORON NITRIDE PREPARATION

[75] Inventors: Carl W. Melton; Dale G. Thompson; Larry F. Vassamillet; Charles E. Wickersham, all of Columbus, Ohio

[73] Assignee: Battelle Development Corporation, Columbus, Ohio

[21] Appl. No.: 820,863

[22] Filed: Jan. 21, 1986

[51] Int. Cl.$^4$ ............................................. C23C 14/34
[52] U.S. Cl. ......................... 204/192.15; 204/192.16; 204/192.12
[58] Field of Search ........... 204/192 R, 192 C, 192 N, 204/192 SP, 164; 427/37, 39, 42

[56] References Cited

U.S. PATENT DOCUMENTS

| | | | |
|---|---|---|---|
| 3,743,551 | 7/1973 | Sanderson | 204/192 C X |
| 4,297,387 | 10/1981 | Beale | 204/192 C X |
| 4,412,899 | 11/1983 | Beale | 204/192 C X |
| 4,415,420 | 11/1983 | Beale | 204/192 R X |
| 4,426,268 | 1/1984 | Cukauskas | 204/192 C |

Primary Examiner—John F. Niebling
Assistant Examiner—Nam X. Nguyen
Attorney, Agent, or Firm—Benjamin Mieliulis

[57] ABSTRACT

A process for producing coatings comprising cubic boron nitride on a substrate is disclosed. The process involves magnetron sputter deposition of a heated BN source in an evacuated atmosphere having a limited partial pressure of nitrogen and a noble gas. During cathodic sputtering of the BN source, a metal dopant selected from Groups IA, IVA, VA, VIIA, IB, IIB, IIIB, IVB and VB of the periodic table, the metal dopant preferably being Al or Cu, is deposited at a concentration less than 1.5 atomic percent.

8 Claims, 2 Drawing Figures

CUBIC BORON NITRIDE PREPARATION

BACKGROUND OF THE INVENTION

1. Field of the Invention

This invention relates to cubic boron nitride and its preparation. More particularly, the invention concerns reactive magnetron sputter deposition being employed to produce coatings comprising cubic boron nitride on substrates for providing abrasion resistant surfaces such as for cutting tools and the like useful products.

2. Description of Related Art

Magnetron sputtering apparati are described in patents such as commonly assigned U.S. Pat. No. 4,407,713 (Zega), incorporated herein by specific reference.

Production of cubic boron nitride (CBN) generally requires high pressure technology and processing techniques. Because of the complexity and inherent low volume of high pressure processing, the presently produced cutting tools with CBN coatings are expensive.

Due to its hardness, abrasion resistance, thermal and mechanical shock resistance, CBN would be wider used if economical processes for its production were available and the geometry of the parts was not so restricted.

It is known that hexagonal boron nitride (BN) can be converted to the cubic form through treatment at high temperatures (1800° C.) and pressures (85 kilobars) with this conversion catalyzed by various materials, such as alkali and alkaline earth metals. A synthesis of CBN from BN is described in U.S. Pat. No. 3,918,219 (Wentorf).

U.S. Pat. No. 3,791,852 (Bunshah) describes a process and apparatus for the production of carbide films by physical vapor deposition in what can be termed to be an activated reactive evaporation deposition technique.

U.S. Pat. Nos. 4,297,387, 4,412,899 and 4,415,420 (Beale) describe activated reactive evaporation methods for depositing CBN on a substrate. These methods seek to form CBN in situ in an ionizing electrical field from reactive constituents comprising metal vapors such as typically boron and aluminum together with ammonia gas or nitrogen to enable nitride formation.

Reactive evaporation methods tend to incorporate contaminants such as oxygen into the deposited coatings. Oxygen incorporation gives rise to formation of $B_2O_3$ brittle coatings. Reactive evaporation methods give results inconsistent in reproducibility. It is not known if the inconsistent reproducibility is attributable to critical configurations in the methodology or whether attributable to the recently discovered short life span of CBN with reversion to amorphous forms upon standing.

Chemical vapor deposition methods require high substrate temperatures which preclude coating tool steel, plastic, or integrated circuits. Ion beam deposition, ion plating and electron beam evaporation are lower temperature processes. However, ion beam deposition suffers from low coating rate ($\sim 100$ Å/min) and short operating life of the coating apparatus while ion plating and electron beam evaporation suffer from problems associated with process control which makes commercialization difficult and expensive.

Surprisingly, CBN appears to be unstable over time reverting from a cubic to an amorphous form within as little as 3 months. Exclusion of oxygen or water does not seem to retard the reversion. The short lived stability of CBN creates a need for low cost, high quality deposition methods which can be useable on site to take advantage of the full life of the CBN.

SUMMARY OF THE INVENTION

The production of cubic boron nitride coatings on substrates such as tool steel by reactive magnetron sputter deposition using a hexagonal boron nitride source and metallic dopant is described.

Metallic dopants incorporated at less than 10 atomic percent and preferably at less than 2 atomic percent catalize the formation of the cubic phase.

The current invention is a simple low temperature coating process capable of depositing CBN coatings at low substrate temperatures and at coating rates of over 400 Å/min.

Figure 1:
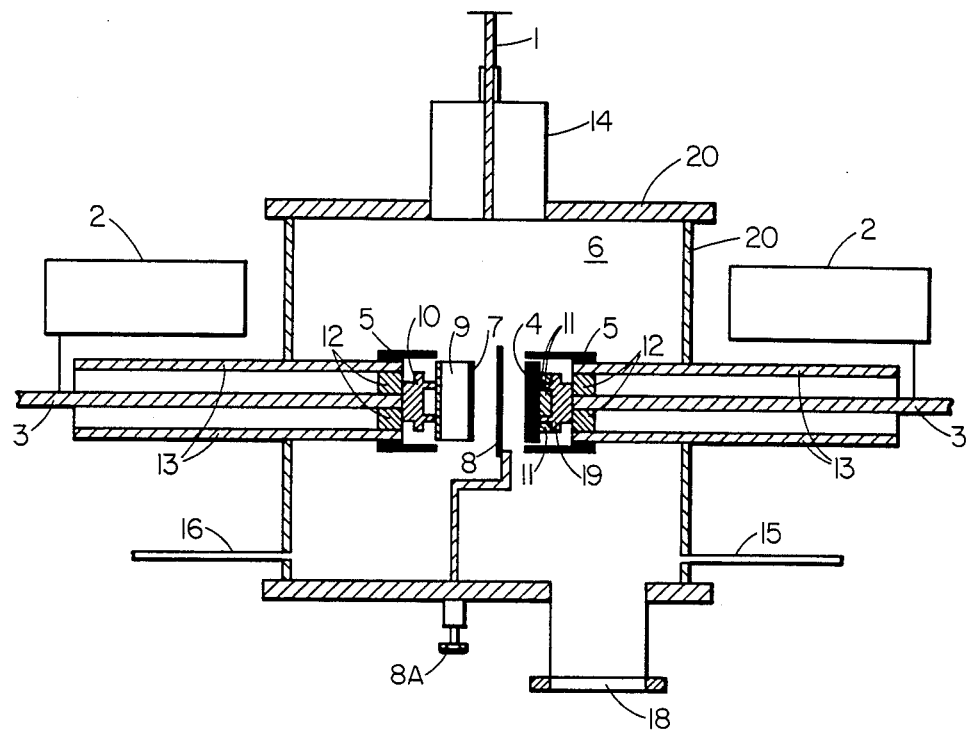
FIG. 1 is a schematic of a sputter coating apparatus.

A schematic diagram of the rf-magnetron rf ion plating process is shown in FIG. 1. A hexagonal phase boron nitride source (target) and a metallic dopant is sputtered with an Ar—$N_2$ glow discharge which is magnetically enhanced. During coating deposition rf power is simultaneously applied to the substrate. Early investigations revealed that, in using a dc biased substrate, as the insulating BN film accumulates the effectiveness of the dc bias is eliminated. Use of an rf bias enables the substrate bias to be maintained even after thick insulating BN coatings are deposited. The addition of small amounts (5-15 atomic %) of oxygen to the film results in improved coating properties. BN films with insufficient oxygen exhibited inferior scratch resistance (soft). However, films with oxygen contents which exceeded 20% oxygen were brittle.

By adjusting the substrate temperature amorphous or cubic phases can be produced. The amorphous phase is produced at temperatures below approximately 130° C. At higher temperature the cubic phase is formed.

DETAILED DESCRIPTION

This invention provides a method for preparing metastable cubic boron nitride for use as a wear resistant coating on a variety of substrates. In the past, cubic boron nitride has been produced in bulk form by expensive high pressure techniques, and in coating form by ion plating pure boron in a nitrogen atmosphere, electron beam evaporating metallic alloying agents with boron in ammonia, by ion beam deposition with $B_3N_3H_6$ gas, and by chemical vapor deposition processes.

The current commercial high pressure techniques are expensive and do not produce coatings. Chemical vapor deposition of boron nitride requires high substrate temperatures which precludes this process from being used to coat tool steel, plastic or integrated circuits. Ion beam deposition, ion plating and electron beam evaporation are lower temperature processes. However, ion beam deposition suffers from low coating rate ($\sim 100$ Å/min) and short operating life of the coating apparatus while ion plating and electron beam evaporation suffer from problems associated with process control which makes commercialization difficult and expensive.

The current invention is a simple low temperature coating process capable of depositing amorphous boron nitride coatings at temperatures below 100° C. at coating rates of over 400 Å/min.

Cubic boron nitride coatings were obtained on tool steel by reactive magnetron sputtering deposition using a hexagonal boron nitride source and metallic dopants (Al or Cu). Effective catalyst quantities for coatings on tool steel were 0.5 to 1.5 atomic percent copper or aluminum. All quantities and percentages stated herein are on the basis of weight unless otherwise indicated. The metal dopant preferably is set up as a second sputtering source, though it is possible to have only a single sputtering source consisting of hexagonal boron nitride which also contains the metal dopant.

It was found that copper and aluminum catalyze the formation of the cubic phase while calcium, chromium and iron do not appear to aid the formation of CBN. Interestingly, valence appears relatively unimportant in the process and surprisingly the ability to form stable nitrides was not important to the effectiveness of a dopant. Iron and aluminum form stable nitrides whereas copper does not. The small quantities of metal required to catalyze the process indicates that the process is not an epitaxial nucleation and growth phenomenon. From our data we would suggest it is reasonable to conclude the process is a catalytic process which somehow lowers the crystallization temperature permitting the formation of crystalline sites. It would, therefore, be expected that metallic additions from Group IA, IVA, VA, VIIA, IB, IIB, IIIB, IVB and VB will facilitate CBN formation. Selected metals from Groups IIA and VIIIA may also catalyze formation of the cubic phase if they improve the crystallization kinetics.

Contaminants were found to be extremely deleterious to CBN formation during the sputtering process. Oxygen, water vapor and carbon are the major process contaminants. Oxygen partial pressure of $1 \times 10^{-4}$ torr leads to forming $B_2O_3$ (50 atomic percent O) rather than the desired cubic boron nitride. Oxygen amounts over 20 atomic percent oxygen result in inferior brittle coatings with $B_2O_3$ bonding.

The coating rate varies with argon and nitrogen pressure. An optimum rate is obtained with a nitrogen pressure of $0.5-1 \times 10^{-3}$ torr and an argon pressure of $1-2 \times 10^{-3}$ torr.

The sharp increase in coating rate with the addition of small amounts of $N_2$ was unexpected and apparently is due to the presence of a penning type of ionization reaction.

Coating rate increases slightly and then decreases with increasing rf substrate bias. A bias of greater than 500 volts was found to be required for the preparation of cubic phases.

The presence of a substrate bias in combination with boron and nitrogen atoms which are accumulating on the substrate causes metastable cubic phases to form. One possible explanation for this effect is that the ion bombardment which results when a substrate bias is present results in a "shot penning" effect producing coating stress which stabilizes the metastable phases. The addition of small amounts of oxygen in solid solution greatly enhances coating properties by increasing coating hardness and adhesion.

The advantages of this invention are as follows:
1. Low temperature process
2. Simple process capable of being scaled up to coat large areas
3. Higher coating rate than ion beam process
4. Metallic stabilizer additions are not needed so a transparent coating is possible (potential market for protecting plastic and glass components)
5. The addition of oxygen greatly enhance overall coating performance.

Good coating properties are obtained when the group III and group V elements are in a 1:1 ratio and when the oxygen content is between 5 and 20 atomic %. Optimum properties appear at an oxygen concentration of around 10 atomic %. It was surprising to find the appearance of optimum film properties when small amounts of oxygen were present.

EXAMPLE

FIG. 1 depicts a schematic of the apparatus used. The sputtering apparatus with casing 20 consists of a 90-liter aluminum vacuum chamber which can be used with up to three sputtering sources in a horizontal plane. The chamber 6 is evacuated with a 400-liter/sec turbomolecular pump, the vacuum pump being attached to outlet 18. Base pressures in the mid-to-low $10^{-6}$ torr range were normally maintained in the chamber. A movable shutter 8 movable for example by rotating means 8A is located between the BN source 4 and the substrate 7. The substrate held by substrate holder 10 and heater 9 is directly across from the 7.6 cm diameter hot-pressed hexagonal BN source 4. A source-to-substrate separation of 7 cm was used. A substrate heater 9 was placed between the substrate holder 10 and the substrate electrode. The heater assembly consists of a 1 cm thick thermal insulator between a water cooled O-ring seal and the substrate holder. An inductive capacitance filter was used to isolate the heater power supply and the thermocouple readout from the large substrate rf bias. Ground shield 5 extended to the back face of the substrate heater. The ground shield was extended to the front face of the substrate holder and heater to prevent deposition of aluminum dopant on the heater. A ground was also provided around the BN source.

Figure 2:
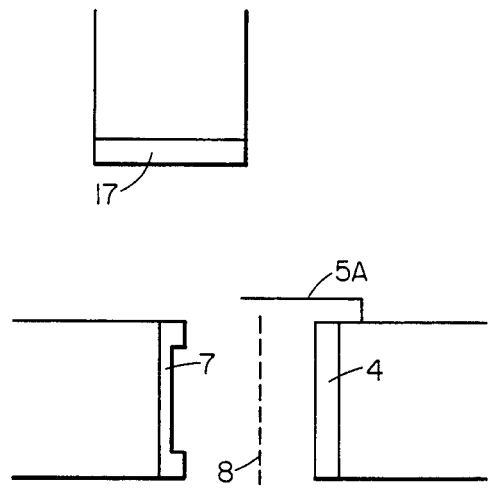
FIG. 2 is a schematic of the arrangement of sources and substrate.

A second sputtering source, 11.4 cm from the BN source center line (depicted in FIG. 2, not shown in FIG. 1, was used to supply metallic dopants when they were used. The metallic dopant source 17, also 7.6 cm diameter, was water cooled, and was located so that its orientation was perpendicular to the center line running from the BN source to the substrate. A schematic of the multiple source arrangement is shown in FIG. 2. An aluminum shield 5A was placed between the BN source and the metal dopant source to reduce deposition of metal atoms on the BN source.

Gases were admitted to the chamber through variable leak valves 15 and 16. Total gas pressure was monitored with a capacitance manometer. Flow of the gases into the chamber was monitored with rotometers. Ultra high purity (99.999 percent) gases (principally argon and nitrogen) were used. Nitrogen was introduced via valve 15, argon via valve 16.

Both the metallic and BN sputtering sources were operated in the magnetron mode. Rare-earth permanent magnets arranged as magnetic array 11 held in support 19 were placed behind the sputtering sources in a configuration which produced closed circular magnetic traps with fields strengths of ~700 gauss. These magnetic traps significantly increased the source emission rates and allowed lowering voltage applied to the sources. The metallic dopant source was operated with a dc power supply. The BN source was powered with a 2-kw rf power supply operating at 13.56 MHz. A 50Ω matching network was placed between the power supply and the BN source.

An rf bias was applied to the substrate electrode, also using a 2 kw rf power supply operating at 13.56 MHz with a 50Ω matching network. A common exciter was used so that both the BN and substrate rf power supplies were in phase. The rf matching networks are depicted by reference character 2. Matching rf circuitry is well known in the art.

Mass spectra of gases in the chamber during coating deposition were obtained with a differentially pumped mass spectrometer attached to the coating chamber. An ion pump was used to differentially pump the mass spectrometer when gases from the sputtering chamber were admitted to the analyzer. The mass spectrum data was corrected for the differences in ion pumping speeds of the various species. The mass and optical spectroscopy data indicate that water vapor and oxygen were the principal contaminants. Background partial pressures of these gases were approximately $5 \times 10^{-8}$ torr and $1 \times 10^{-8}$ torr, respectively.

A typical sputter coating trial started by placing the substrate on the aluminum sample holder and inserting the holder into the vacuum chamber through the air lock 14 using substrate insertion rod 1. The sample holder was locked into position on the rf biased electrode (water cooled) 3 and heater, and the insertion rod 1 was removed. Water cooled electrodes 3 are held within grounded support 13 and held by insulator 12. System base pressure was reduced to below $5 \times 10^{-6}$ torr before sputtering operations began. Argon was then admitted into the sputtering chamber to a predetermined level, and the substrates were then sputter cleaned. Once the sputter cleaning step was complete, nitrogen was added to the desired level, and the coating deposition was initiated by applying rf power to the water cooled BN source. An rf substrate electrode bias between 0 and 1000 volts was maintained on the substrate electrode during deposition.

When metal doping was used, the metal target was switched on after the BN target was operating. The time between activating the BN source 4 and the metallic source varied from a few seconds to several minutes, depending on whether a thin amorphous BN bond layer was desired. If the metallic source activation was delayed, an undoped amorphous BN layer was initially deposited.

After a few deposition runs, the dc powered Al target became nitrided on its surface. Because of its insulating nature, this surface nitride caused the sputtering rate to decrease. Periodic sputter cleaning runs were required to maintain a clean Al target. In a production type arrangement, this problem could be overcome by rf powering the Al dopant target or by predoping the BN target. If an rf powered dopant target is used, it should be electrically in phase with the biased substrate and BN target.

When the substrate heater was used, the temperature of the substrates, monitored by a thermocouple attached to the back surface, was allowed to come to equilibrium prior to starting the coating trial. Equilibration times ranged from 15 to 60 minutes.

At the conclusion of a coating trial, the power to the sputtering sources and the substrate was turned off, and the substrate was retrieved from the system by inserting the sample rod, picking up the substrate holder and removing the holder through the air lock.

Coating samples were prepared in a number of ways depending on the substrate used. Principal substrate materials used included:

(1) Glass microscope slides. These were used for deposition rate determinations and residual stress measurements. Glass slides were cleaned ultrasonically in a heated detergent bath, rinsed in deionized water, rinsed in methyl alcohol, and dried prior to use.

(2) Carbon coated copper electron microscope grids. These grids were used because of the ease with which they could be examined in the electron microscope. No pretreatment was performed on these grids.

(3) Tool steel. This substrate material was first heat treated, in vacuum at approximately 1200 C. and then slowly cooled in argon to room temperature then ground and polished to a 0.05-μm diamond surface finish. Polished substrates were ultrasonically degreased, rinsed, and then stored in reagent grade methyl alcohol. H-13 was the grade of tool steel principally used for coating with CBN.

(4) Tungsten carbide. Cleaning procedures were the same as those for tool steel.

Processing parameters for production of CBN are set forth in Table 1.

TABLE 1

| Process Parameters | |
| --- | --- |
| Substrates | Glass slide, H-13 and M-1 tool steel, WC, carbon coated Cu grid, NaCl, Si, glass cover slip |
| Substrate rf Bias | to 1000 V; 0 to 250 W; preferably 300–600 V |
| Substrate Temp, C. | Ambient to 369 C., preferably >130° C. |
| Target | BN |
| Target Dopants | Al, Cu |
| Dopant Current | 0.01 to 0.55 amp |
| Base Pressure | 0.7 to 30 × $10^{-6}$ torr; preferably 5 × $10^{-6}$ torr |
| Partial Pressure | Ar, 0.5 to 20 × $10^{-3}$ torr N$_2$, 0.5 to 5 × $10^{-3}$ torr |
| Sputter Cleaning | Ar, 1 to 17 × $10^{-3}$ torr rf bias, 170 to 1000 v; 0.11 to 0.85 amp; 40 to 250 W Time, 10 to 45 minutes |
| Coating Thickness | 0.025 to 4 μm |

Experiments carried out according to the above protocol enabled the following conclusions to be drawn:

(1) Cubic boron nitride (CBN) coatings at least 2 microns thick can be reproducibly applied to tool steel (and C) if the proper combination of deposition parameters, metallic dopant addition, and low contaminant presence is provided.

(2) Rates of deposition of 400 Å/min are easily achievable by sputtering methods. Potential exists for greater rates.

(3) In addition to O$_2$ levels below 20 at. percent, the following deposition parameters were found to be best for applying CBN coatings to tool steel by sputtering:
Argon gas: $1 \times 10^{-3}$ torr to $1.5 \times 10^3$ torr
Nitrogen gas: $0.5 \times 10^{-3}$ torr to $1 \times 10^{-3}$ torr
Bias on the substrate electrode: 600 volts
Substrate temperature: 200 C.

(4) Metallic dopant was required for formation of CBN coatings. 0.5 to 1.5 at. percent Al or Cu were successful.

(5) The presence of contaminants in the vacuum system is extremely deleterious. Oxygen of approximately 20 at. percent or higher in the coating prevents CBN formation. Although amorphous coatings were wear resistant, they were less so than CBN. Presence of C in the coatings did not prevent CBN formation, but limited the amount of N, and thereby CBN, in the coating. Larger amounts caused soft coatings due to BO and free C in coatings.

(6) $O_2$ partial pressure of $1 \times 10^{-4}$ torr resulted in 50 at. percent 0 in coatings, whereas $1-5 \times 10^{-6}$ torr resulted in 10 to 15 at. percent 0 in coatings which contained CBN.

(7) rf-induced bias on the substrate was found to be more effective than dc bias for CBN deposition, due to the presence of the insulating BN coating being deposited.

(8) The optimum substrate bias level for CBN deposition by sputtering appears to differ when chamber parameters are varied. Deposition rate increases and then decreases with increasing bias, and the resultant BN structure varies from amorphous to zinc blende cubic to hexagonal as the bias is increased from 0 to 1000 V. The microstructure also varies, being fine grained or even powdery with high bias voltages. The optimum substrate electrode bias for the experimental conditions used was in the range of 300 to 600 V.

(9) Microstructure and crystal structure were affected by substrate temperature. Coatings were continuous and amorphous with substrates at chamber ambient temperature ($\sim$50 C.), and were continuous and cubic at 200 C. A substrate temperature of 350 to 400 C. resulted in large grain or powdery CBN coatings.

(10) Good adhesion of CBN to tool steel was improved by:
Application of a 0.1 micron Cr base coating
Sputter etch cleaning, which was more effective than the Cr base coating.

(11) The wear-resistance results for CBN coatings were related to adhesion, since failures usually occurred by spallation. The best wear resistance results was obtained with samples having the best adhesion.

(12) The best specific wear value obtained for a CBN coating was $1.5 \times 10^9$ cc/kg-km. This value is an order-of-magnitude better than that for uncoated tool steel.

(13) In limited evaluations, deterioration of CBN coatings appeared to have occurred after 3 months.

The principles, preferred embodiments, and modes of operation of the present invention have been described in the foregoing specification. The invention which is intended to be protected herein, however, is not to be construed as limited to the particular forms disclosed, since these are to be regarded as illustrative rather than restrictive. Variations and changes can be made by those skilled in the art without departing from the spirit and scope of the invention.

We claim:

1. A method for deposition of cubic boron nitride on a substrate, which method comprises the steps of:
   (a) supporting a substrate on an rf biased electrode in a near vacuum at a base pressure below approximately $30 \times 10^{-6}$ torr whereby oxygen levels in deposited coatings are restricted to below 20 atomic percent,
   (b) heating the substrate to at least 130° C.,
   (c) introducing a noble gas to a partial pressure not exceeding $20 \times 10^{-3}$ torr,
   (d) introducing nitrogen to a partial pressure not exceeding $5 \times 10^{-3}$ torr,
   (e) cathodically sputtering a BN source,
   (f) during cathodic sputtering of the BN source, cathodically sputtering a metal dopant source consisting of a metal selected from Groups IA, IVA, VA, VIIA, IB, IIB, IIIB, IVB, and VB of the periodic table such that dopant is deposited at less than 1.5 atomic percent,
   whereby a cubic boron nitride coating is deposited on the substrate.

2. The method according to claim 1 whereby the base pressure is below approximately $5 \times 10^{-6}$ torr.

3. The method according to claim 1 whereby the noble gas is argon.

4. The method according to claim 1 wherein the BN source contains the metal dopant.

5. A method for deposition of cubic boron nitride on a substrate, which method comprises the steps of:
   (a) supporting a substrate on an rf biased electrode in a near vacuum at a base pressure below approximately $30 \times 10^{-6}$ torr whereby oxygen levels in deposited coatings are restricted to below 20 atomic percent
   (b) heating the substrate to at least 130° C.
   (c) introducing a noble gas to a partial pressure not exceeding $20 \times 10^{-3}$ torr
   (d) introducing nitrogen to a partial pressure not exceeding $5 \times 10^{-3}$ torr
   (e) cathodically sputtering a BN source
   (f) during cathodic sputtering of the BN source, cathodically sputtering a metal dopant source consisting of Al or Cu such that dopant is deposited at less than 1.5 atomic percent,
   whereby a cubic boron nitride coating is deposited on the substrate.

6. The method according to claim 5 whereby the base pressure is below approximately $5 \times 10^{-6}$ torr.

7. The method according to claim 5 whereby the noble gas is argon.

8. The method according to claim 5 wherein the BN source contains the metal dopant.

* * * * *